United States Patent [19]

Morano

[11] Patent Number: 5,450,026
[45] Date of Patent: Sep. 12, 1995

[54] CURRENT MODE DRIVER FOR DIFFERENTIAL BUS

[75] Inventor: David A. Morano, Middletown Township, Monmouth County, N.J.

[73] Assignee: AT&T Corp., Murray Hill, N.J.

[21] Appl. No.: 281,057

[22] Filed: Jul. 27, 1994

[51] Int. Cl.[6] .................................... H03K 19/0175
[52] U.S. Cl. .................................... 326/84; 326/86; 326/64; 327/542
[58] Field of Search .................... 326/82–84, 326/86, 90, 57–58, 64, 66–67, 115; 327/542

[56] References Cited

U.S. PATENT DOCUMENTS

| | | | |
|---|---|---|---|
| 4,864,159 | 9/1989 | Cornelissen | 326/66 |
| 4,890,010 | 12/1989 | Neudeck et al. | 326/86 |
| 5,122,692 | 6/1992 | Seki | 326/66 |
| 5,146,111 | 9/1992 | Ciraula et al. | 326/83 |

*Primary Examiner*—Edward P. Westin
*Assistant Examiner*—Jon Santamauro

[57] ABSTRACT

The current mode bus driver which is disclosed couples input digital signals to a bus which is normally biased with a voltage difference representing one binary type. The current mode bus driver responds to input digital signals of the other binary type by connecting a current source to one lead of the bus and a current sink to the other lead of the bus, thereby driving the bus to a voltage difference which represents the other binary type. In response to input digital signals of the first-mentioned binary type, the bus driver isolates the current source and current sink from the bus and connects the current source directly to the current sink. The selective switching is performed by n-channel MOSFETs which are driven by the input digital signals through unique buffer driver circuits employing a CMOS inverter, an n-channel MOSFET and an NPN transistor. A combination of MOSFETs and NPN transistors provide a current source and sink that permit operation of the bus at very low voltage levels.

8 Claims, 5 Drawing Sheets

CURRENT MODE DRIVER FOR DIFFERENTIAL BUS

FIELD OF THE INVENTION

This invention relates to circuits that can be used to drive differential backplane buses and more particularly to circuits which drive these buses in a way such that the difference in voltage on the bus represents a digital binary value.

DESCRIPTION OF THE RELATED ART

A typical prior art differential bus for ECL (emitter coupled logic) consists of differential leads that must be isolated from the bus when a master is not using the bus. ECL achieves this isolation by using a third output state of the driver which is a high impedance isolation state. When using ECL type signal levels, both signal paths are biased equally to an appropriate ECL termination voltage which is normally 2 volts below the top rail voltage. With this termination bias arrangement, an unbalanced signal wave will propagate when going into or out of the high impedance isolation condition. Since the first bit that is driven after coming out of the isolation condition propagates as an unbalanced wave, its electrical characteristics are significantly poorer than a differentially driven signal. This causes a constraint that limits the speed of the bus.

Another difficulty with ECL is that it does not provide a boolean function on the bus which can be used for arbitration and control functions. If one bus master asserts a logic zero while another bus master asserts a logic one in ECL, the signal on the bus is undefined, and the output is simply noise. Single ended buses such as TTL do provide a boolean function but as pointed out hereinabove such buses suffer from high power or lack of noise immunity.

Still another difficulty with commonly used interface technologies, such as TTL, PECL, ECL, BTL, and GTL, is that they use voltage mode bus drivers which drive the bus to certain predetermined voltages to represent the logic states. As the speed requirement in buses for telecommunications applications increases, the time slot period for one bit approaches the amount of time that a signal edge takes to traverse a fraction of the backplane length. As a result, the last digital bit from one of the masters can be passing a second master on the bus when it is time for that second master to begin transmission. If the second master sees the digital value on the bus which it intends to transmit, the voltage mode bus driver from that second master will not contribute to the bus until that last bit from the first master is ended. This causes the bus driver in the second master to produce a first digital bit with less than the full time slot periods, and this short digital bit typically cannot be properly received.

The problems pointed out herein above with respect to prior art backplane buses are solved in accordance with the invention described in my copending application entitled "Backplane Bus For Differential Signals" which has been filed on the same date herewith. In this invention a backplane bus for differential signals is provided wherein two signal leads are present for each of the digital bits to be transmitted on the bus. The two signal leads for each one of the digital bits are terminated with their characteristic impedances by a network at each end of the transmission paths, and these networks bias the two signal leads with a different DC voltage on each one of the two leads. This normally present DC voltage difference between the two leads represents one of the two binary digital states. Digital information is coupled to the two leads of the bus for each digital bit through a current mode bus driver which couples current into one of the two leads and out of the other one of the two leads in response to the other binary digital state, thereby changing the difference in voltage between the two leads. Accordingly, the current mode bus driver for this new advantageous bus must be isolated from the bus for one of the two binary digital states and must couple current into one of the two leads of the bus and out of the other one of the two leads of the bus for the other one of the two binary digital states. SUMMARY OF THE INVENTION The present invention involves a current mode bus driver which is useful in coupling an input digital signal to a differential voltage bus of the type which is biased with a voltage difference representing one binary type. In accordance with the present invention, a current source is connected to one lead of the bus and a current sink is connected to the other lead of the bus when the input digital signal represents the other binary type, thereby changing the voltage difference on the bus to represent that other binary type. When the input digital signal represents the first-mentioned binary type, the current source and are current sink are connected together and isolated from the bus.

It is an aspect of the present invention that the current source and current sink are switchably connected together or to the bus by MOSFETs whose gates are driven by unique buffer driver circuits each of which uses an NPN transistor to drive the gate of a MOSFET with a high peak current thereby ensuring rapid switching of voltages on the bus.

It is another aspect of the present invention that the current source and current sink are provided by a unique combination of MOSFETs and NPN transistors thereby permitting the differential voltages on the bus to swing around a lower voltage than would otherwise be permitted.

DESCRIPTION OF THE PREFERRED EMBODIMENT

Figure 1:
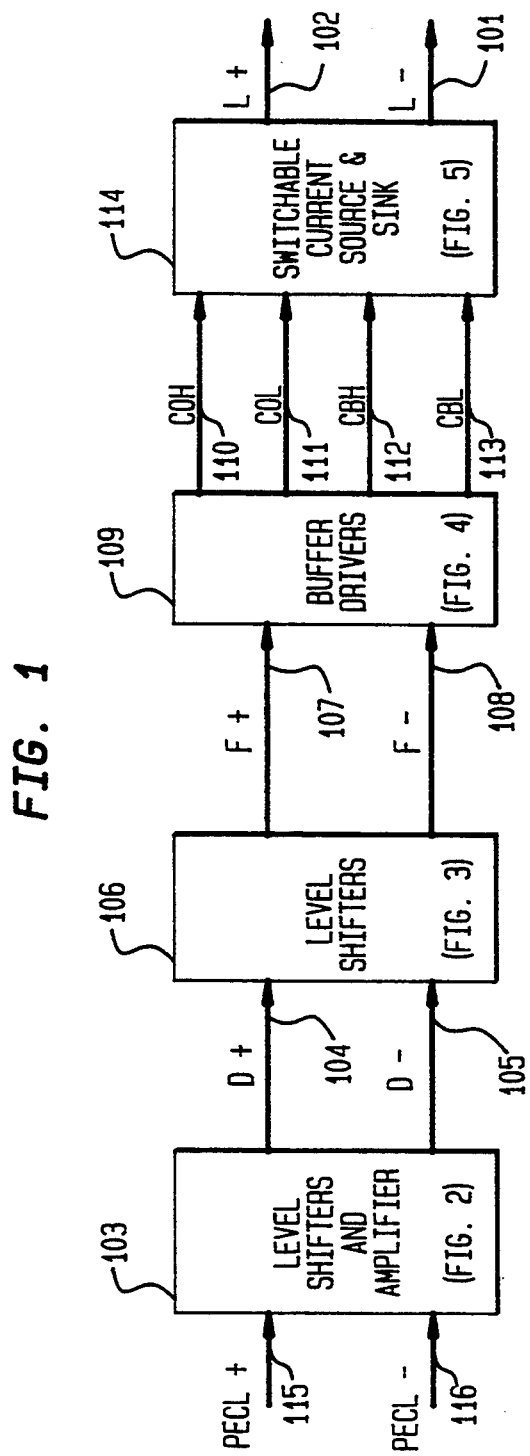
FIG. 1 is a block diagram of the entire current mode bus driver which illustrates how FIGS. 2–5 must be placed in order to obtain a complete schematic diagram of the circuit.

A current mode bus driver of the type useful in coupling pseudo or positive emitter coupled logic (PECL) signals to the $D^2L$ backplane bus disclosed in my above-identified copending application is shown in FIG. 1. As indicated in FIG. 1, the circuits of FIGS. 2, 3, 4 and 5 are connected in tandem as shown to provide an apparatus which causes the PECL differential voltage signals to operate the signal leads L+ and L− of the BUS. The operation of the entire apparatus will be more readily understood after reading the following detailed description of the operation of the individual circuits of FIGS. 2–5.

As pointed out in my copending patent application, the essential characteristic of the current mode bus driver of FIG. 1 is to supply a current source to one signal lead of the bus and a current sink to the other signal lead of the bus for an input binary value of one type, and to isolate the current source and sink from the bus for an S input binary value of the other type. The part of the apparatus in FIG. 1 which accomplishes this task is present in the circuit of FIG. 5, and it is therefore most useful in obtaining an understanding of the present invention to discuss this circuit first. The remaining circuits of FIGS. 2–4 simply modify the voltage levels of the PECL signals at the input of the apparatus and increase their power level to the point where they can effectively switch the current source and sink at a high rate of speed with digital signals on lines 110–113 at the input of block 114 in FIG. 1.

Figure 5:
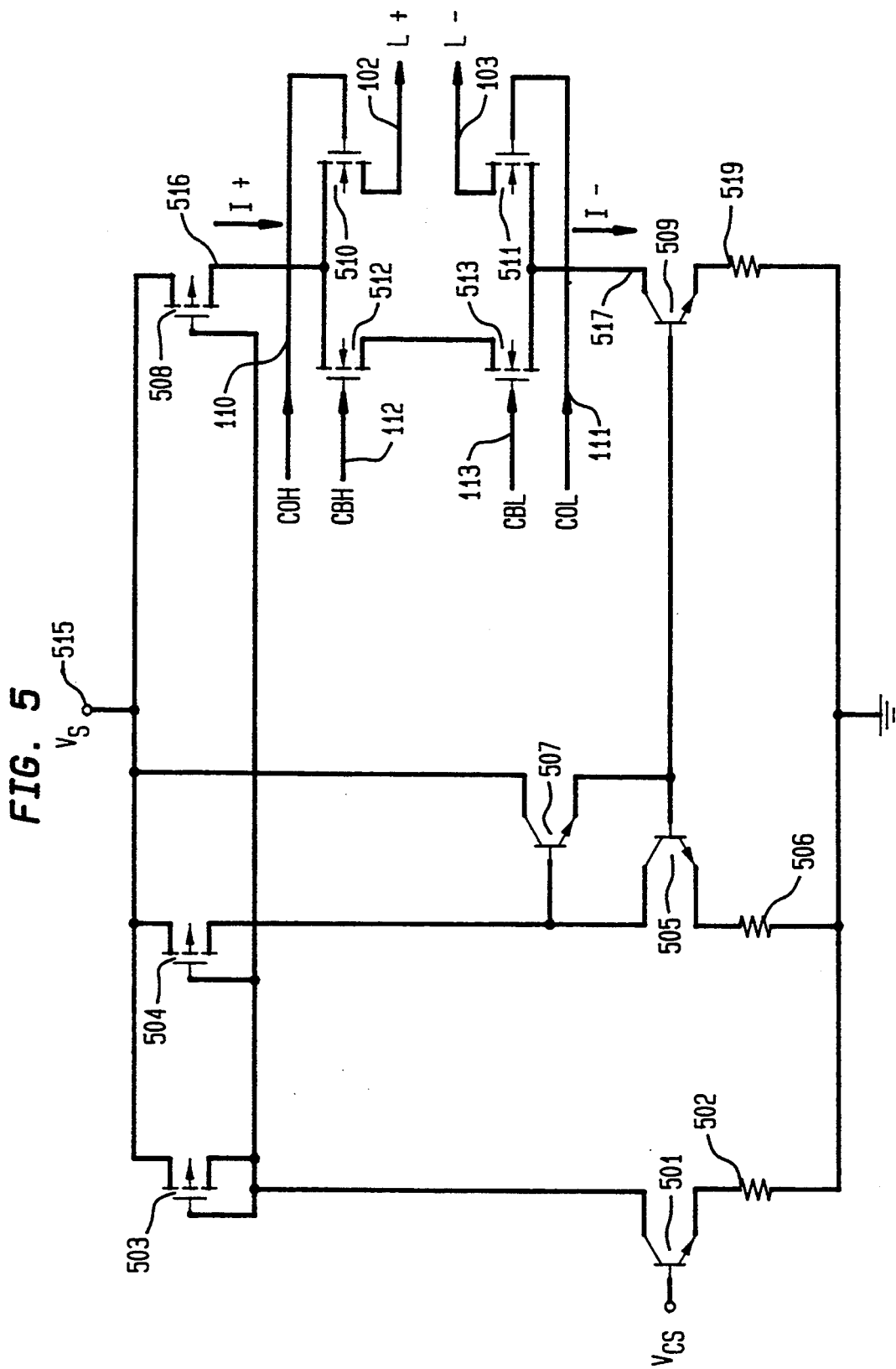
FIG. 5 is a schematic diagram of a current source and current sink used to drive the MOSFET switches which either connect the current source and current sink to the leads of the bus or connect the current source to the current sink in isolation from the bus.

In FIG. 5, a fixed reference potential, $V_{cs}$, is coupled to the base of an NPN transistor 501 whose emitter is connected through a resistor 502 to ground thereby establishing a reference current into the collector of transistor 501. The collector of transistor 501 is connected to, and the reference current is drawn from, the drain of a metal oxide semiconductor field effect transistor (MOSFET) 503 of the p-channel enhancement type. The gate of MOSFET 503 is also connected to its drain, and its source electrode is connected to a potential source 515 of $V_s$, which in the present embodiment is equal to 5 volts. A MOSFET 504 of the p-channel enhancement type also has its source electrode connected to the potential source of $V_s$, and has its gate electrode connected to the gate electrode of MOSFET 503. As will be appreciated by those skilled in the art, MOSFET's 503 and 504 are connected in a current mirror arrangement whereby the current out of the drain of MOSFET 504 is related to the current out of the drain of MOSFET 503 by the ratio of the widths of the gate electrodes. Since the current out of the drain of MOSFET 503 is only used as a reference current, it is set, by choosing the value of resistor 502, equal to about one-fourth the current out of the drain of MOSFET 504 in order to reduce the amount of power consumed. In the present embodiment, the desired current is equal to about 10 ma., and the reference current is equal to about 2.5 ma. Accordingly, the width of the gate electrode of MOSFET 504 is chosen to be equal to four times the width of the gate electrode of MOSFET 503.

A MOSFET 508 of the p-channel enhancement type also has its source electrode connected to the potential source, $V_s$, and its gate electrode connected to the gate electrode of MOSFET 503 with a gate electrode width equal to that of MOSFET 504. As a result a mirrored current of about 10 ma. is available from the drain of MOSFET 508 on line 516. This is the current which in selected cases will be switched in a manner to be described hereinafter onto signal lead 102 (L+) of the BUS.

To provide a current sinks the mirrored current out of the drain of MOSFET 504 is coupled into the collector electrode of an NPN transistor 505. The collector of transistor 505 is connected to its base electrode through the base-emitter junction of an NPN transistor 507, the collector electrode of which is connected to the potential source 515 of $V_s$. The emitter of transistor 505 is connected through a resistor 506 to ground. An NPN transistor 509 with an emitter area equal to that of transistor 505 has its base electrode connected to the base of transistor 505, and its emitter electrode connected to ground through a resistor 510 substantially equal in value to resistor 506. Those skilled in the art will recognize the circuit arrangement provided by transistors 505, 507 and 509 as a current mirror which provides a current sink at the collector of transistor 509 for a current, I−, on line 517 equal in value to the current being driven into the collector of transistor 505. As pointed out herein above, this current into the collector of transistor 505 is equal in value to the current, I+, on line 516, and therefor the magnitude of current source of I+ is substantially equal to the magnitude current sink of I−.

The current, I+, on line 516 is connected to the drain of an n-channel enhancement type MOSFET 510 whose source is connected to signal lead 102 (L+) and whose gate is connected to receive a digital signal (COH) present on line 110. When the gate of MOSFET 510 is hard driven with a sufficiently high positive potential, the current, I+, is coupled through to signal lead 102 (L+) of the BUS. Similarly, the current, I−, on line 517 is connected to the source of an n-channel enhancement type MOSFET 511 whose drain is connected to signal lead 101 (L−) of the BUS and whose gate is connected to receive a digital signal (COL) on line 111. When the gate of MOSFET 511 is hard driven with a sufficiently high positive potential, signal lead 101 (L−) of the BUS is connected through to the current sink, I−, on line 517.

The current, I+, on line 516 is also connected to the drain of a n-channel enhancement type MOSFET 512 whose gate is connected to receive a digital signal (CBH) on a line 112. The source of MOSFET 512 is directly connected to the drain of an n-channel enhancement type MOSFET 513 whose gate is connected to receive a digital signal (CBL) on line 113 and whose source is connected to the current sink, I−, on line 517. When the gates of MOSFET's 513 and 514 are hard driven by a sufficiently high positive potential on line 112 (CBH) and line 113 (CBL), the current source I+ is coupled through the MOSFET's to the current sink I−. As a result, by operating COH and COL out of phase with CBH and CBL, the current source and current sink can be rapidly switched between the signal leads of the BUS and isolated from the BUS without introducing large transient effects. Consequently, the circuit of FIG. 5 can be driven by signals from any other type logic system such as ECL or PECL by translating the signals from that other logic system into signals on lines 110–113 with the correct polarity and sufficient power to operate the switches represented by MOSFET's 510–513.

Figure 4:
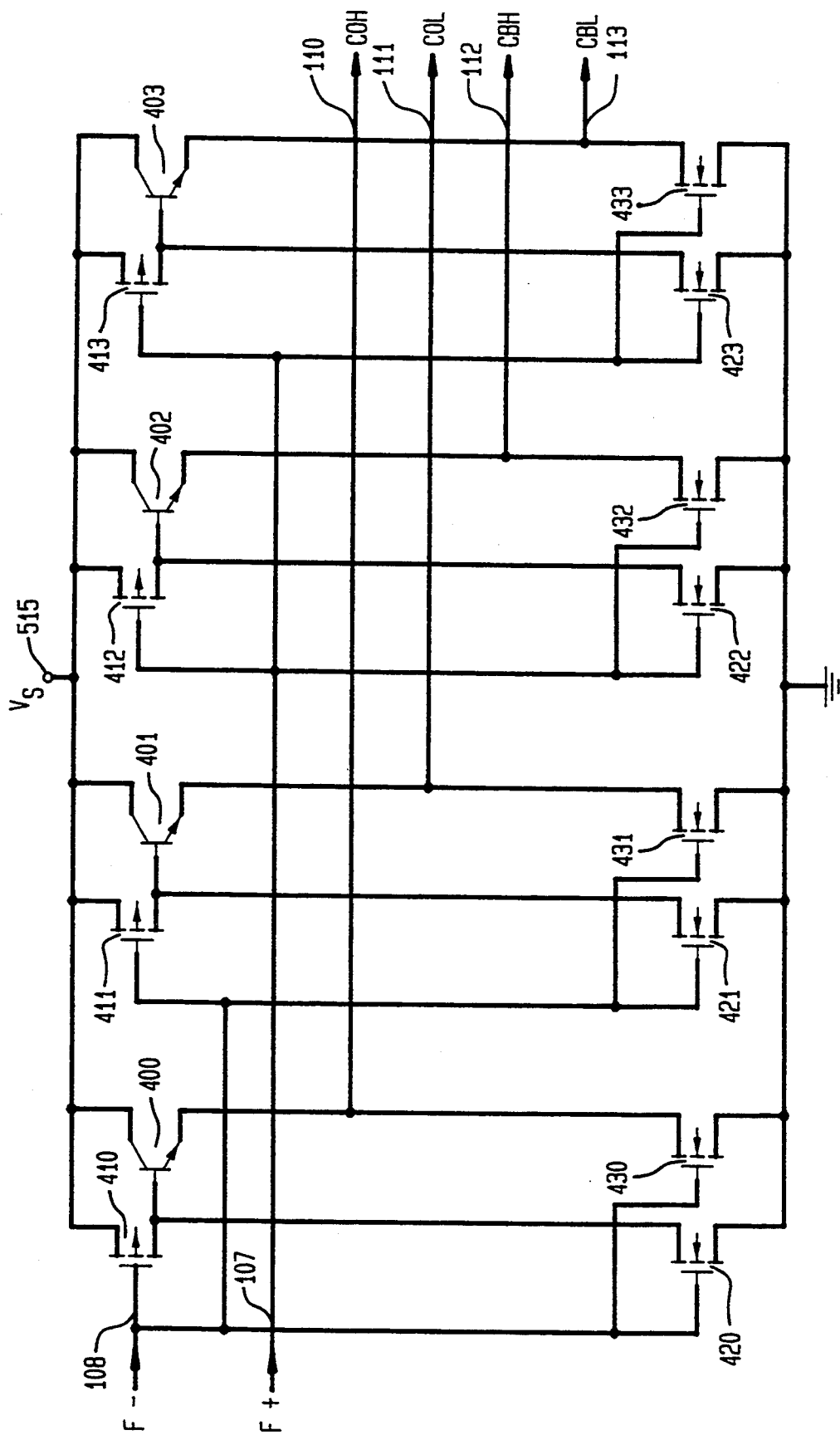
FIG. 4 is a schematic diagram of buffer driver circuits used to convert the level shifted signals from FIG. 3 into signals with sufficient peak current to drive the gates of the MOSFET switches in FIG. 5.

The amount of current required to drive the MOSFET switches into saturation at a rapid rate is quite high, in the order of 6 ma. peak current. The circuit of FIG. 4 has four novel buffers which can advantageously provide this high peak current on lines 110–113 in response to two digital input signals F+ and F− on lines 107 and 108 respectively. In FIG. 4, lines 110–113 are each connected to the emitter of an NPN transistor 400–403 respectively. The collector electrodes of these transistors 400–403 are all connected to the positive potential source 515 of $V_S$. P-channel enhancement type MOSFET's 410–413 are connected with n-channel enhancement type MOSFETs 420–423 to form four standard complementary metal oxide semiconductor (CMOS) inverters. The base electrode of each of the NPN transistors is connected to the output of one of these inverters. Consequently, if the gate of any one of the MOSFETs 410–413 is driven with a sufficiently low voltage relative to the positive potential source, $V_S$, the MOSFET drives its respective NPN transistor toward conduction and the corresponding MOSFET switch in FIG. 5 is closed. As shown in FIG. 4, MOSFET's 410 and 411 are driven by the F-signal on line 108 whereas MOSFET's 412 and 413 are driven by the F+ signal on line 107.

In the present embodiment each F signal has a voltage transition of about 2.0 volts centered about 2.5 volts, that is, each F signal swings between 1.5 and 3.5 volts. With a signal potential of about 3.5 volts on either of the lines 107 or 108, the corresponding p-channel MOSFET (410–413) passes so little current that the corresponding NPN transistor is no longer able to conduct since the corresponding n-channel MOSFET (420–423) is driven toward saturation by the 3.5 volts thereby effectively removing current which would otherwise flow into the base electrode of the corresponding NPN transistor.

Finally the circuit of FIG. 4 must remove current from the gate electrodes of the MOSFET switches of FIG. 5 when the switch is intended to be turned off. To accomplish this task n-channel enhancement type MOSFET's 430–433 each has its drain electrode connected to one of the lines 110–113 respectively, and its source connected to ground. The gate of each of the MOSFET's 430–433 is connected to the F signal driving its respective switch in FIG. 5. Consequently, when the F− signal on line 108 is driven to the 3.5 volt level, MOSFET's 430 and 431 are driven toward saturation thereby causing MOSFET switches 510 and 511 in FIG. 5 to be turned off. Similarly, when the F+ signal is driven to the 3.5 volt level, MOSFET's 432 and 433 are driven toward saturation thereby causing MOSFET switches 512 and 513 in FIG. 5 to be turned off. In summary, the low level of 1.5 volt for the F-signal on line 108 causes the circuit of FIG. 5 to connect the current source and sink to the signal lines 102 and 101 of the BUS, and the low level of 1.5 volt for the F+ signal on line 107 causes the current source and sink to be connected together and isolated from the BUS. The high level signal of 3.5 volt on either of the F signals causes its corresponding MOSFET switch to be rapidly turned off.

Figure 2:
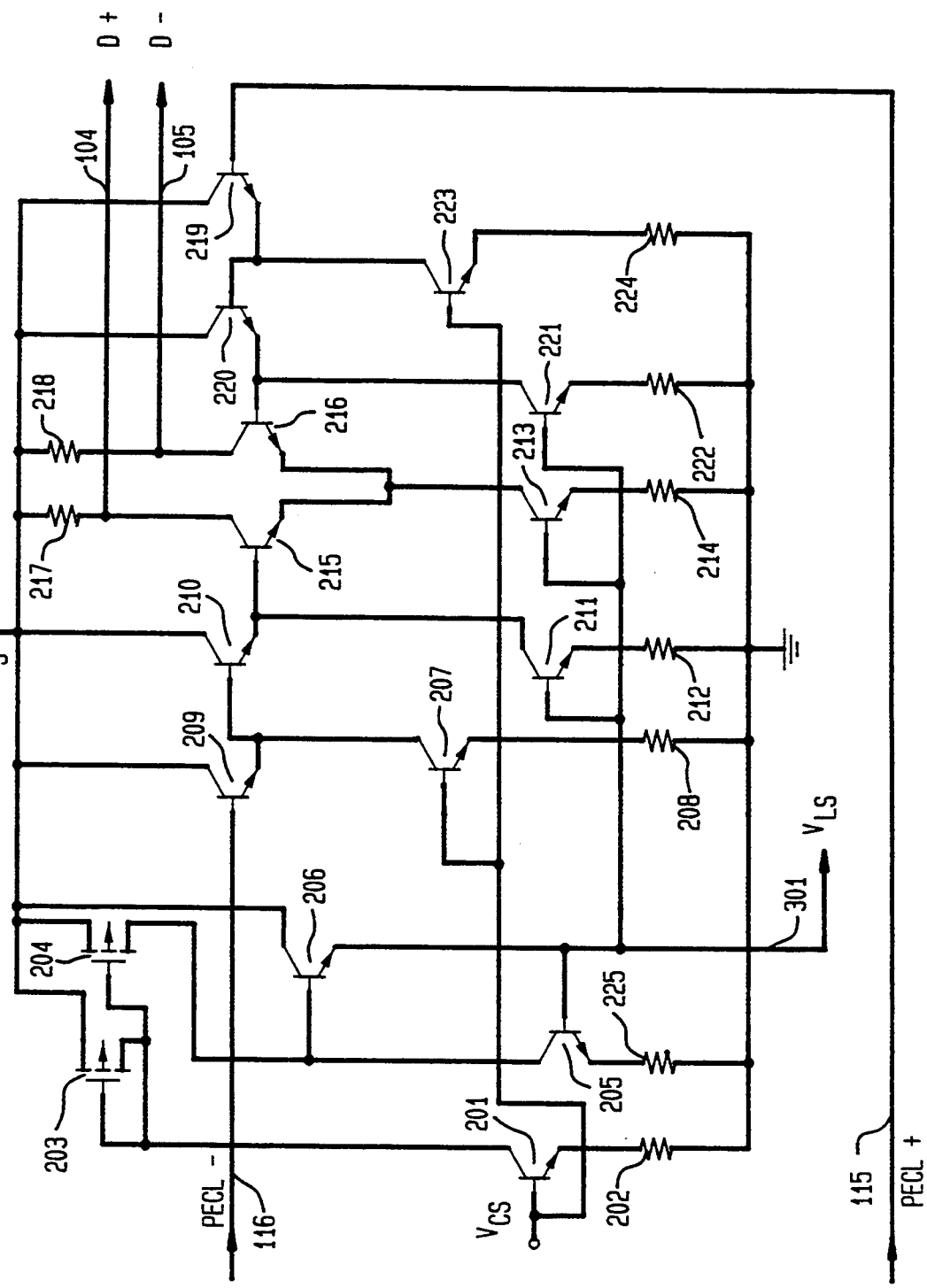
FIG. 2 is a schematic diagram of the level shifters and amplifier used to process input PECL signals.
Figure 3:
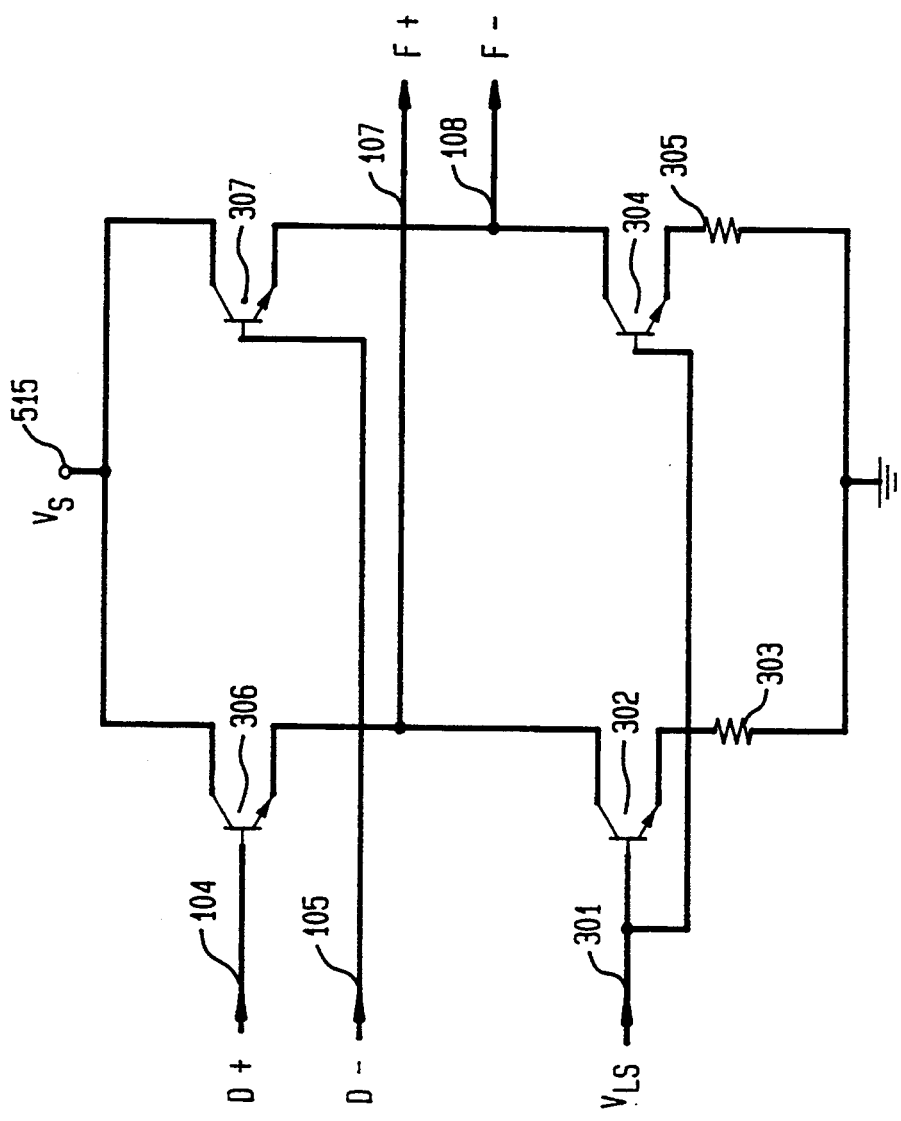
FIG. 3 is a schematic diagram of level shifters used to further shift the level of signals at the output of the circuit of FIG. 2.

To summarize thus far, differential voltage digital signals represented by F+ and F− on lines 107 and 108 respectively can be used to drive a D²L bus of the type disclosed in my above-identified copending application. As indicated herein above, the F signals have a 2.0 volt swing around a median value of about 2.5 volts. Those skilled in the art can use this information to design circuits which can translate any one of the well known digital formats into F signals that can be used to drive the FIGS. 4 and 5 apparatus. The present embodiment shown in FIG. 1 uses input signals on lines 115 and 116 from a positive or pseudo ECL (PECL) system. Each PECL signal has a swing of about 0.8 volts around a median voltage of about 3.6 volts. The function of the remainder of the circuits shown in FIGS. 2 and 3 is to translate the input PECL signals into F signals on lines 107 and 108 which can properly drive the buffer driver circuits of FIG. 4.

In FIG. 1, the fixed reference potential ($V_{CS}$) of about 1.8 volts is connected to the base of an NPN transistor 201. The emitter of transistor 201 is connected through a resistor 202 to ground and its collector is connected to the drain of a p-channel enhancement type MOSFET 203. MOSFET 203 is connected with a p-channel enhancement type MOSFET 204 in a current mirror arrangement which functions in a fashion identical to that of the current mirror arrangement discussed herein above in connection with MOSFET's 503 and 504. As a result, the reference current established into the collector of transistor 201 is mirrored out of the drain of MOSFET 204, and this mirrored current is coupled into the collector of an NPN transistor 205 which in turn is connected with transistor 206 and resistor 225 in an arrangement which functions in a fashion identical to that described herein above with respect to elements 505–507 in FIG. 5. As a result, a reference potential, $V_{LS}$, is established at the base of transistor 205.

The fixed reference potential, $V_{CS}$, is also connected to the base electrodes of transistors 207 and 223 each of which has its emitter electrode connected through a resistor (208 and 224 respectively) to ground. The current into the collector of transistor 207 is drawn from the emitter of an NPN transistor 209 whose collector is connected to the 5.0 volt potential source 515 and whose base is connected to line 116 to receive the PECL− signal. The emitter follower stage formed by transistor 209 simply drops the PECL− signal by about 1 volt. In a similar fashion an NPN transistor 219 provides an emitter follower stage with the current into the collector of transistor 223 to receive and drop the potential of the PECL+signal on line 115.

The reference potential of $V_{LS}$ on the base of transistor 205 is coupled to the bases of NPN transistors 211, 213, and 221 each of which has its emitter electrode connected through resistors 212, 214 and 222, respectively, to ground thereby forming three more current sinks into their collector electrodes. The NPN transistors 210 and 220 are connected to two of these current sinks to form two additional emitter followers that serve to drop the PECL− and PECL+ signals out of the first emitter follower stages by an additional volt. The resulting digital signals at the emitters of transistors 210 and 220 are now centered around a potential of about 1.6 volts as compared with the 3.6 volt of the original PECL signals.

The current into the collector of transistor 213 is drawn from the emitter electrodes of NPN transistors 215 and 216 each of which has its collector electrode connected through a resistor 217 and 218 respectively to form a differential amplifier stage. This differential amplifier stage has its inputs (bases of transistors 215 and 216) connected to receive the signals at the emitters of transistors 210 and 220. The amplified signals are the D+ and D− signals provided on the lines 104 and 105 in FIG. 1. These amplified D signals have about a 2 volt swing centered around about 3.5 volts.

In FIG. 3, the reference potential of $V_{LS}$ from FIG. 2 is connected by way of line 301 to the base electrodes of NPN transistors 302 and 304 each of which has its emitter electrode connected through a resistor 303 and 305, respectively, to ground. The resulting current sinks into the collectors of transistors 302 and 304 are drawn from the emitters of NPN transistors 306 and 307 each of which has its collector electrode connected to positive potential source 515 in order to form two additional emitter follower stages. The D+ and D− signals on lines 104 and 105 are coupled to the base electrodes of transistors 306 and 307 respectively. As a result the amplified digital D signals from FIG. 2 are dropped by about an additional volt to now provide the F+ and F− signals on lines 107 and 108 respectively. As pointed out herein about these F signals are now centered about 2.5 volts with a swing of about 2 volts and are now of the proper potential and magnitude to drive the buffer driver circuits of FIG. 4.

What has been described herein above is an illustrative embodiment of the present invention. Numerous departures may be made by those skilled in the art without departing from the spirit and scope of the present invention. For example, many other types of circuits could be used to translate either PECL signals or other forms of digital signals into the proper amplitude and polarity so as to drive the buffer amplifiers of FIG. 4.

What is claimed is:

1. A current mode bus driver for coupling input digital logic signals to a bus consisting of two signal leads, said bus driver comprising means for providing a current source, means for providing a current sink, means responsive to an input digital logic signal of one binary type for coupling said current source means to one of said two signal leads and said current sink means to the other of said two signal leads, and means responsive to an input digital logic signal of the other binary type for coupling said current source means to said current sink means.

2. A current mode bus driver as defined in claim 1 wherein said means for coupling said current source means to one of said two signal leads and said current sink means to the other of said two signal leads includes a first and second metal oxide semiconductor field effect transistor (MOSFET) each of which has a source, drain and gate electrode, said first MOSFET having its drain and source electrodes connected between said current source means and the one of said two signal leads, said second MOSFET having its drain and source electrodes connected between said current sink means and the other of said two signal leads, and means for selectively coupling said input digital logic signals to the gate electrodes of said first and second MOSFETs.

3. A current mode bus driver as defined in claim 2 wherein said means for coupling said current source means to said current sink means includes third and fourth MOSFETs each of which has a source, drain and collector electrode, means for connecting said drain and source electrodes of said third and fourth MOSFETs in series with said current source means and said current sink means with the source of said third MOSFET being directly connected to the drain of said fourth MOSFET, and means for selectively coupling said input digital logic signals to the gate electrodes of said third and fourth MOSFETs.

4. A current mode bus driver as defined in claim 3 wherein said means for selectively coupling said input digital logic signals to the gate electrodes of said first and second MOSFETs includes a pair of buffer driver circuits each one of which comprises a complementary metal oxide semiconductor (CMOS) inverter having an input and an output, means for coupling said input digital logic signals to the input of said CMOS inverter, an NPN transistor having emitter, base and collector electrodes with its collector electrode connected receive to a positive potential source and its base electrode connected to the output of said CMOS inverter, an n-channel MOSFET having drain, source and gate electrodes, the drain electrode of said n-channel MOSFET being connected to the emitter electrode of said NPN transistor, the source electrode of said n-channel MOSFET being connected to receive a ground potential, and the gate electrode of said n-channel MOSFET being connected to the input of said CMOS inverter.

5. A current mode bus driver for coupling input digital logic signals to a bus consisting of two signal leads, said bus driver comprising means for providing a current source, means for providing a current sink, and selective switching means having two control inputs connected to receive said input digital logic signals for coupling said current source means to one of said two signal leads and said current sink means to the other one of said two signal leads in response to an input digital logic signal of only one binary type; said selective switching means including first and second metal oxide semiconductor field effect transistor (MOSFET) each of which has a source, drain and gate electrode, said first MOSFET having its drain and source electrodes connected between said current source means and the one of said two signal leads, said second MOSFET having its drain and source electrodes connected between said current sink means and the other of said two signal leads, means for selectively coupling said input digital logic signals to the gate electrodes of said first and second MOSFETs, third and fourth MOSFETs each of which has a source, drain and collector electrode, means for connecting said drain and source electrodes of said third and fourth MOSFETs in series with said current source means and said current sink means with the source of said third MOSFET being directly connected to the drain of said fourth MOSFET, and means for selectively coupling said input digital logic signals to the gate electrodes of said third and fourth MOSFETs.

6. A current mode bus driver as defined in claim 5 wherein said means for selectively coupling said input digital logic signals to the gate electrodes of said first and second MOSFETs includes a pair of buffer driver circuits each one of which includes a complementary metal oxide semiconductor (CMOS) inverter having an input and an output, means for coupling said input digital logic signals to the input of said CMOS inverter, an NPN transistor having emitter, base and collector electrodes with its collector electrode connected to receive a positive potential source and its base electrode connected to the output of said CMOS inverter, an n-channel MOSFET having drain, source and gate electrodes, the drain electrode of said n-channel MOSFET being connected to the emitter electrode of said NPN transistor, the source electrode of said n-channel MOSFET being connected to a ground potential, and the gate electrode of said n-channel MOSFET being connected to the input of said CMOS inverter.

7. A current mode bus driver as defined in claims 1 or 5 wherein said current source means comprises a first p-channel MOSFET having a drain, source and gate electrode, an NPN transistor having an emitter, base and collector electrodes, a resistive element connected between said emitter electrode and a ground potential, means for connecting a reference potential to the base electrode of said NPN transistor, and means for connecting said source electrode to a potential source, means for directly connecting said drain and gate electrodes to said collector electrode whereby a reference current is established out of said drain and into the collector of said collector electrode, a second p-channel MOSFET having a drain, source and gate electrode, means for connecting the drain of said second MOSFET to said potential source, and means for directly connecting the gate of said second p-channel MOSFET to the gate of said first p-channel MOSFET whereby a source of current is established at the drain electrode of said second p-channel MOSFET.

8. A current mode bus driver as defined in claim 7 wherein said current sink comprises a third p-channel MOSFET having a source, drain and gate electrode, means for connecting the source of said third p-channel MOSFET to said potential source, means for connecting the gate of said third MOSFET to the gate of said first MOSFET, a second NPN transistor having emitter, base and collector electrodes, a second resistive element connected between the emitter electrode of said second transistor and said ground potential, means for directly connecting the collector electrode of said second transistor to the drain of said third MOSFET, a third NPN transistor having its base connected to the drain of said third MOSFET and its emitter connected to the base of said second transistor, the collector of said third transistor being connected to said potential source, a third resistive element, and a fourth NPN transistor having its emitter connected through said third resistive element to ground and its base electrode connected to the base electrode of said second transistor, whereby the collector of said fourth transistor provides a sink of current relative to said ground potential.

* * * * *